United States Patent [19]

Yonehara et al.

[11] Patent Number: 5,495,824
[45] Date of Patent: Mar. 5, 1996

[54] METHOD FOR FORMING SEMICONDUCTOR THIN FILM

[75] Inventors: Takao Yonehara; Yoshiyuki Osada, both of Kanagawa, Japan

[73] Assignee: Canon Kabushiki Kaisha, Tokyo, Japan

[21] Appl. No.: 352,113

[22] Filed: Dec. 1, 1994

Related U.S. Application Data

[63] Continuation of Ser. No. 155,635, Nov. 22, 1993, abandoned, which is a continuation of Ser. No. 682,680, Apr. 9, 1991, abandoned.

[30] Foreign Application Priority Data

| Apr. 10, 1990 | [JP] | Japan | 2-94778 |
| Jun. 6, 1990 | [JP] | Japan | 2-147863 |

[51] Int. Cl.⁶ .................................................. H01L 21/20
[52] U.S. Cl. ........................ 117/8; 117/930; 437/108; 437/109
[58] Field of Search ........................... 437/109, 108, 437/173, 174, 967, 973, 942; 148/DIG. 154, DIG. 122, DIG. 25; 117/8, 930

[56] References Cited

U.S. PATENT DOCUMENTS

| 3,900,345 | 8/1975 | Lesk. | |
| 4,151,008 | 4/1979 | Kirkpatrick | 437/942 |
| 4,897,360 | 1/1990 | Guckel et al. | 437/233 |
| 4,915,772 | 4/1990 | Fehlner et al. | |

FOREIGN PATENT DOCUMENTS

| 1139453 | 1/1983 | Canada | 437/973 |
| 56406 | 4/1983 | Japan. | |
| 253616 | 10/1988 | Japan. | |
| 4550 | 5/1989 | WIPO. | |

OTHER PUBLICATIONS

P. Kwizera, et al "Solid Phase Epitaxial Recrystallization of Thin Polysilicon Films Amorphized by Silicon Ion Implantation" Appl. Phys Lett 41(4) 15 Aug. 1982, pp. 379–381.

E. Murakami, et al "Crystal Defect Study of Solid Phase Epitaxially Grown Si Surrounded by $SiO_2$ Structures" Extend. Abs. of 20th (1988 Int.) Conf on Solid State Devices and Materials Tokyo (1988) pp. 185–188.

Noguchi, et al "Polysilicon Super Thin Film–Transistor Technology" Mat. Res. Soc. Symp. Proc. vol. 106 (1988) MRS pp. 293–304.

S. Wolf and R. N. Tauber, *Silicon Processing for the VLSI Era Volume 1: Process Technology,* Lattice Press, Sunset Beach, CA (1986) pp. 175–176.

*Primary Examiner*—R. Bruce Breneman
*Assistant Examiner*—Linda J. Fleck
*Attorney, Agent, or Firm*—Fitzpatrick, Cella, Harper & Scinto

[57] ABSTRACT

A method of forming a semiconductor thin film by crystallizing a thin film crystal from an amorphous thin film. A plurality of small regions which are preferentially made nuclei generation points are formed at predetermined positions in the amorphous thin film. Solid phase growth from single nuclei formed in the small regions is preferentially effected by heating to form a crystalline semiconductor thin film in which the grain boundary positions are adjusted to the desired positions. This crystalline semiconductor thin film is subjected to a heat treatment to reduce defects in crystal grains.

18 Claims, 5 Drawing Sheets

METHOD FOR FORMING SEMICONDUCTOR THIN FILM

This application is a continuation of application Ser. No. 08/155,635, filed Nov. 22, 1993, now abandoned; which in turn, is a continuation of application Ser. No. 07/682,680, filed Apr. 9, 1991, now abandoned.

BACKGROUND OF THE INVENTION

1. Field of the Invention

This invention relates to a method of forming a semiconductor thin film applicable to a constituent element of a three-dimensional integrated circuit or to a large-area electronic device.

2. Description of the Prior Art

In the field of crystal forming technology for making a crystalline thin film grow on an amorphous substrate, a method has been proposed in which an amorphous thin film previously formed on a substrate is processed by a heat treatment at a temperature lower than the melting point to effect solid phase growth. For example, T. Noguchi, H. Hayashi and H. Ohshima disclosed a method of this kind in 1987 Materials Research Society Symposium Proceeding Vol. 106, "Polysilicon and Interface," p. 293, Elsevier Science Publishing, New York, 1988.

In this method, polycrystalline Si is deposited on $SiO_2$ by a low pressure chemical vapor deposition (LPCVD) method, $Si^+$ ions are injected into the deposited Si to make the same amorphous, and a crystal is thereafter grown therefrom by heat treatment at about 600° C. It is known that this method enables formation of a thin film of large-grain-size dendrite polycrystal having a maximum grain size of 5 μm.

Figure 6:
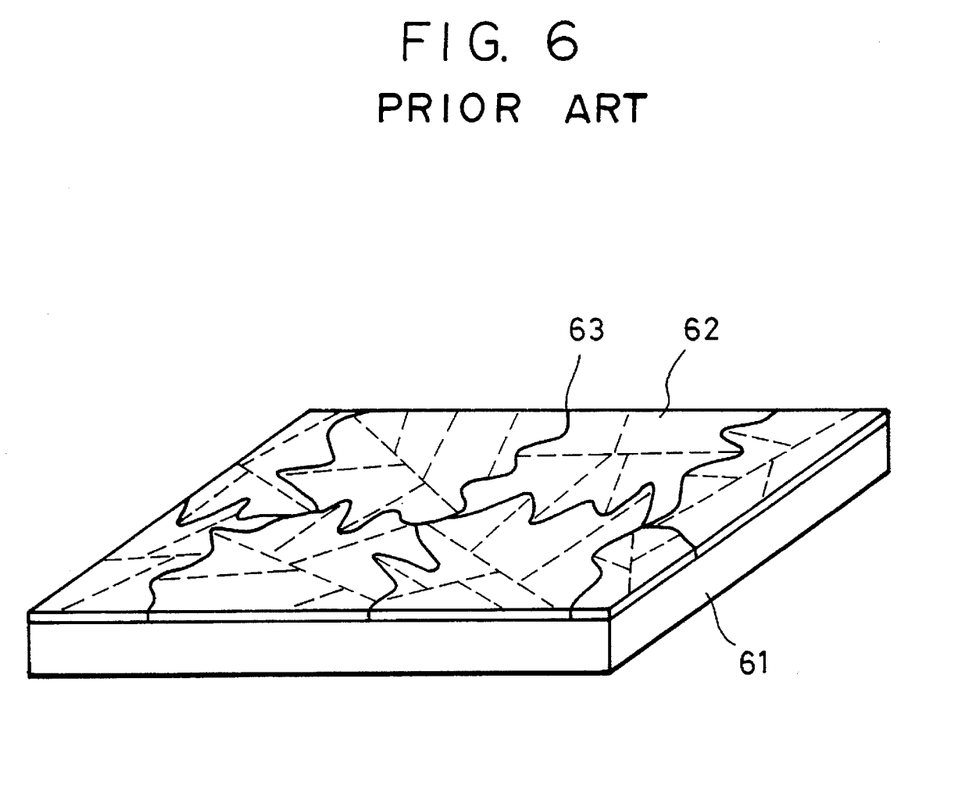
FIG. 6 is a schematic diagram of a semiconductor thin film formed by the conventional method.

FIG. 6 schematically shows a polycrystalline thin film obtained by this method. As shown in FIG. 6, grain boundaries cannot be made linear, and it is difficult to control the grain boundary position with accuracy. Dendrite crystal referred to herein denotes a crystal having internal twin boundaries and growing by extending lateral branches in all directions. In FIG. 6, reference characters 61, 62, and 63 respectively indicate a substrate, crystal grains, and grain boundaries. In a central portion of each crystal grain, a region where the degree of damage due to ion injection is low is defined.

The polycrystalline thin film obtained by this method has a grain size several hundred times greater than that of a conventional thin film formed in a polycrystalline structure only by deposition, and can be used for manufacture of a high-performance electronic device.

For example, if this polycrystalline thin film is used for a field effect transistor, the transistor can operate at an electron mobility about ten times higher than that in the case of a thin film formed in a polycrystalline structure only by CVD.

However, the thin film formed by this crystal growth method has the following two drawbacks.

The first drawback is that although the maximum grain size of the solid phase grown film is increased to a size on the μm order, the grain size distribution and the positions of crystal grain boundaries are not controlled. This is because the crystallization of the amorphous Si thin film is based on the solid phase growth of crystal nuclei generating randomly in the amorphous structure by heat treatment, and because the positions of grain boundaries formed by collision of crystal grains are therefore disordered so that the grain size is distributed over a wide range.

It is known that a multiplicity of carrier traps cluster together at each grain boundary and that they form a barrier against transportation of carriers. That is, the positions of grain boundaries greatly influence characteristics of the electronic device made thereon. For example, a thin film having a maximum grain size of 5 μm, which was obtained by making a thin film amorphous by Si ion injection and heat-treating the thin film in $N_2$ at 600° C. for 50 hours, was observed with a transmission electron microscope to examine the grain size distribution in detail. It was thereby found that the majority of the crystal grains had grain sizes smaller than 1 μm and that the grain size was distributed widely over a range of 0.1 to 5 μm. It was also observed that this distribution greatly influenced characteristics of a transistor formed on the film, specifically, dispersions of mobility, threshold, and subthreshold characteristics in the wafer. This influence is particularly strong when the channel length is smaller than the maximum grain size. This is because disorder of the grain size and grain boundaries reduces the uniformity of the number and amount of barriers in the channel. This problem is very serious in terms of integrated circuit design.

The second drawback resides in crystalline defects in crystal grains. As mentioned above, a solid phase grown crystal is a dendrite crystal, and this crystal grows by introducing a multiplicity of twin boundaries in it and by extending lateral branches. A high resolution test was made with respect to a group of crystals growing between lateral branches by observation using a transmission electron microscope, and a discontinuity in lattice fringes was thereby observed.

Large-grain-size dendrite crystals were examined by electron beam analysis using a low-magnification electron microscope, and it was thereby found that large-grain-size dendrite crystals having a size on the μm order were single crystals generally uniform in crystal orientation.

Defects in crystal grains act as obstructions against carrier movement. If a short channel device having a channel length smaller than the maximum grain size is manufactured, it cannot stand comparison with a bulk Si device in performance.

SUMMARY OF THE INVENTION

In view of the above-described two problems of the convention method, an object of the present invention is to provide a crystal forming method in which nuclei formation positions in solid phase are controlled to enable formation of a single crystal region where the grain boundary position is determined and where defects are reduced.

To achieve this object, according to the present invention, there is provided a method of forming a semiconductor thin film based on crystallizing a thin film crystal from an amorphous thin film comprising the steps of: forming a plurality of small regions at predetermined positions in the amorphous thin film, the small regions being nuclei generation points; subjecting the amorphous film having said small regions to a first heat treatment to generate nuclei which continue to grow in solid phase to form a crystalline semiconductor thin film having crystal grains with preselected grain boundary positions; and subjecting the crystalline semiconductor thin film to a second heat treatment to reduce defects in said crystal grains.

DESCRIPTION OF THE PREFERRED EMBODIMENTS

The following are preferred semiconductor thin film forming methods in accordance with the present invention.

A semiconductor thin film forming method of the present invention is characterized in that in a process of forming a semiconductor thin film by crystallizing a thin film crystal from an amorphous thin film by solid phase growth, a plurality of small regions which are preferentially made nuclei generation points are formed at predetermined positions in the amorphous thin film, solid phase growth from single nuclei formed in the small regions is preferentially effected by heating to form a crystalline semiconductor thin film in which the grain boundary positions are adjusted to the desired positions, and this crystalline semiconductor thin film is subjected to a heat treatment to reduce defects in crystal grains.

Another semiconductor thin film forming method of the present invention is characterized in that in a process of forming a semiconductor thin film based on crystallizing a thin film crystal from an amorphous thin film by solid phase growth, the amorphous thin film is previously separated or formed into a plurality of pieces or lands, a small region of which is preferentially made a nucleus generation point is formed at a predetermined position in each of the separated amorphous thin film lands, solid phase growth from a single nucleus formed in each small region is preferentially effected by heating to form crystalline semiconductor thin films having crystal grains, and the crystalline semiconductor thin films are subjected to a second heat treatment to reduce defects in the crystal grains.

According to the present invention, a thin film, e.g., a large-grain-size dendrite Si crystal thin film having grain boundary positions suitably controlled, is heat-treated by, for example, being irradiated with incoherent light, so that crystalline defects in crystal grains can be reduced without any substantial grain boundary movement. If a semiconductor device is formed on the crystalline semiconductor thin film thereby obtained, the device can be designed so as to be improved in performance and uniformity.

Also, according to the present invention, crystal regions each consisting of a single domain containing no boundary can be formed at desired positions by a low-temperature treatment without changing the flat thin film form.

Consequently, the present invention makes it possible to manufacture a device reduced in characteristic dispersion over a large area.

In accordance with the present invention, nuclei are generated at desired positions in the amorphous thin film by a heat treatment, and dendrite crystals are grown from this nuclei by solid phase growth so as to determine the grain boundary positions.

The nucleus generation region can be provided by, for example, a method described below.

In the amorphous thin film, small regions are formed which are damaged by ion injection to a smaller extent in comparison with other regions. First, ions of the same material as the constituent of the amorphous thin film are injected into the amorphous thin film so as to define such small regions in the vicinity of the interface between the amorphous thin film and the substrate. Thereafter, the film undergoes a heat treatment at a comparatively low temperature (e.g., 700° C.) so that nuclei are preferentially formed from the small regions. This heat treatment may be effected by an ordinary heating means such as an electric furnace.

The nuclei continue growing in solid phase while generating twins until they have a size on the μm order. The points from which solid phase crystal growth is started (i.e., the positions of nuclei) are previously determined so that the growth is stopped when end surfaces of adjacent large-grain-size dendrite crystals contact each other to form grain boundaries at the desired positions.

Crystal grains having a size on the μm order and containing defects are thereby formed in the predetermined positions, while the amorphous regions are completely crystallized. As a result, a polycrystalline thin film is formed in which the position of the grain boundary between adjacent nucleus generation regions is determined generally at the middle of the distance therebetween.

To effect growth of a monocrystalline region alone without forming any grain boundaries, the amorphous thin film may previously be separated into pieces or lands of a certain size. For example, an Si thin film having a several micron square size smaller than the maximum grain size can be formed.

The polycrystalline thin film (or monocrystalline thin film) obtained in the way above-described is heat-treated. This heat treatment is effected at a temperature (e.g., 1100° C.) such that no grain boundary movement takes place and that defects in crystal grains (twins, micro twins, dislocations, stacking faults, point defects and the like) are reduced.

Heating with incoherent light at a temperature lower than the melting point is suitable for this treatment. When heating with incoherent light a high heating temperature can be increased or reduced easily in a short time in comparison with the ordinary electric furnace. In addition it permits a heat treatment over a large area at a time in comparison with beam scanning using coherent light such as laser light. Finally, heating with incoherent light permits only the thin film to be selectively heated by selecting the wavelength range.

Also, when incoherent light is used, occurrence of unevenness of heating due to interference of light can be prevented even if the film thickness varies slightly, and the whole irradiated surface can be heated uniformly.

Preferably, the temperature rise rate is 100° to 500° C./sec., and the heating time is 1 to 3 minutes.

Preferably, heating with incoherent light is effected in an inert atmosphere such as an atmosphere of nitrogen gas or an inert gas at an atmospheric pressure, reduced pressure or increased pressure.

The present invention will be described below in more detail.

An important point of the present invention relates to how the positions at which crystals grow in solid phase are controlled. That is, it is important to preferentially generate nuclei in particular regions of the amorphous thin film and to limit nuclei generation in other regions.

The inventors of the present invention have found a phenomenon in which when an amorphous Si layer is heat-treated which layer is formed by depositing a polycrystalline Si film on a substrate formed of a material such as $SiO_2$ having a small nucleus formation density and by thereafter injecting, for example, Si ions into the polycrystalline Si film to make the same amorphous, the crystal nucleus generation temperature (crystallization temperature) is greatly influenced by the ion injection energy.

The inventors have tried to determine how the crystal nucleus generation temperature is influenced by the ion injection energy, and have found the facts described below in detail.

If the ion injection energy is changed, the distribution of injected Si ions in the Si layer made amorphous (amorphous Si layer) is changed, so that the distribution of generated vacancy, i.e., the distribution of regions in which injection damage exists is changed in the direction of film thickness by the injection energy.

Also, in the amorphous material, embryos formed by overcoming surface energy deficiency are further grown to form nuclei and, thereafter, a phase change from the amorphous phase of Si atoms to the crystalline phase takes place.

Nucleus formation is divided into uniform nucleus formation and non-uniform nucleus formation. The former is nucleus formation in a uniform material (e.g., in an amorphous Si film), and occurrence of this nucleus formation mainly depends upon whether or not embryos formed by overcoming surface energy deficiency can be grown. In the latter non-uniform nucleus formation, nucleus generation is promoted by contact with a foreign matter. The activation energy for the latter is lower than that for the former. That is, non-uniform nucleus formation is occurs easier than uniform nucleus formation. Actually, the speed of nucleus formation in the amorphous Si thin film is mainly determined by non-uniform nucleus formation in the vicinity of the interface on the substrate.

The inventors of the present invention have found that the depth at which the amount of injected ions is maximum (projected range) considerably influences the non-uniform nucleus formation at the interface even under a condition of a constant amount of injected ions.

Figure 1:
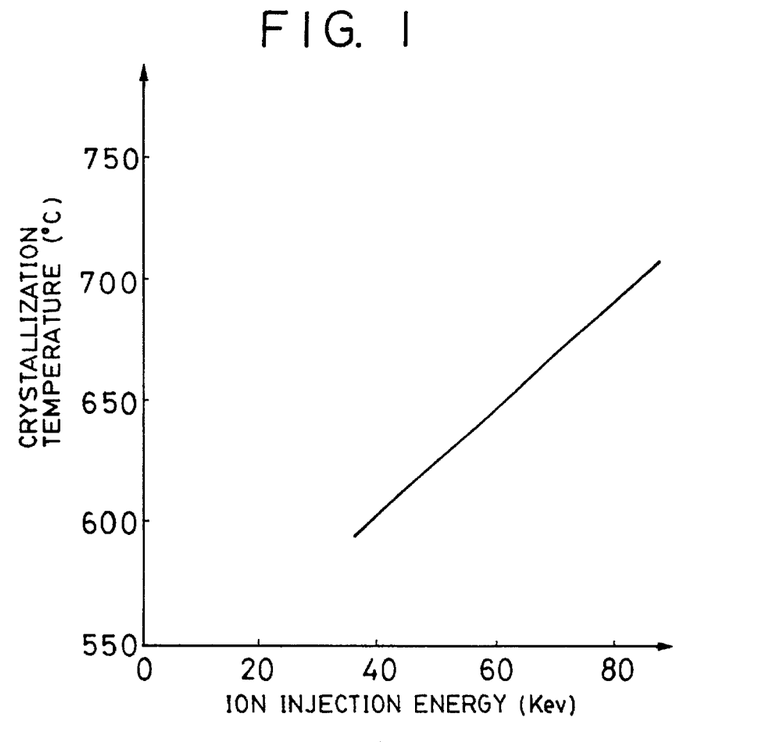
FIG. 1 is a graph of the relationship between ion injection energy and crystallization temperatures.

FIG. 1 shows a graph of the relationship between ion injection energy and crystallization temperatures.

The relationship shown in FIG. 1 was obtained under the following conditions. First, a polycrystalline Si layer having a thickness of 100 nm was formed on an $SiO_2$ substrate by decomposition of $SiH_4$ at 620° C. based on the low pressure CVD method. Then, ions were injected into the polycrystalline Si layer. The injected ions were Si ions. The amount of injected ions was set to a constant value exceeding a critical amount (about $10^{15}$ cm$^{-2}$). The injection energy was changed from 40 to 80 keV. In the ion injected layer, Si atoms are knocked from the lattice position by collision of ions, and the degrees of damage of damaged regions in the direction of thickness are continuously distributed by injecting an amount of ions greater than the critical amount, so that the polycrystalline Si layer becomes amorphous. Amorphous Si layers formed in this manner were heat-treated at different temperatures for 20 hours in an $N_2$ atmosphere, and the recrystallization process in solid phase of each sample was observed mainly by using a transmission electron microscope to examine the crystallization temperature under the above-mentioned condition.

Figure 2:
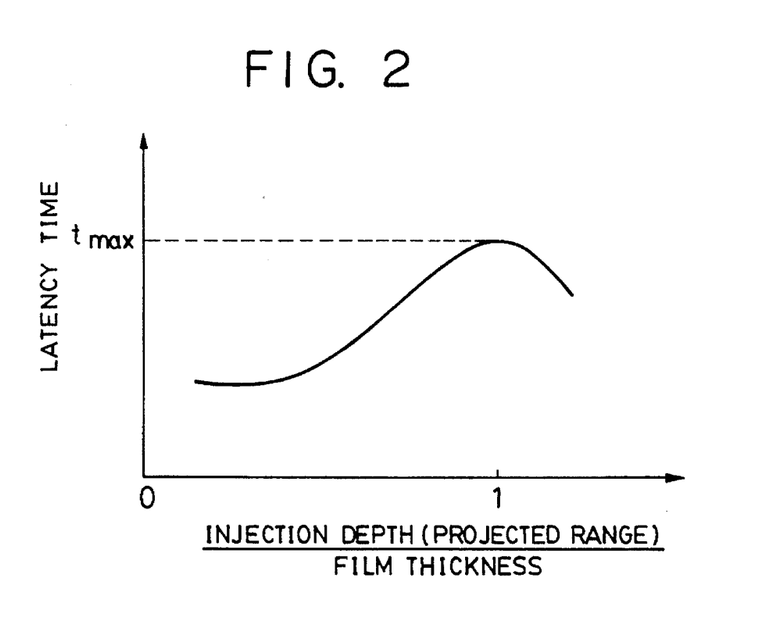
FIG. 2 is a graph of the relationship between the projected range and the latency time.

For example, the results of observation with respect to injection energies of 40 keV and 70 keV will be explained below. The injection depths (projected ranges) at 40 keV and 70 keV are 55.2 nm and 99.7 nm. In the 100 nm Si layer, these values respectively correspond to the points in the vicinity of the center of the layer in the direction of thickness and in the vicinity of the interface on the substrate. As can be read from FIG. 1, there is a difference of 50° C. or more between the corresponding crystallization temperatures, and the crystallization temperature of the Si layer injected in the vicinity of the substrate interface (i.e., at injection energy of 70 keV) is higher and the layer is difficult to crystallize. It is thought that in the case of the latter ion injection the damaged region is so large as to extend to the interface so that crystal growth based on non-uniform nucleus formation is restricted. Further, a layer which was made amorphous by ion injection at 70 keV so that the projected range extended to a point in the vicinity of the interface was heat-treated at a temperature at which a layer made amorphous by ion injection at 40 keV so that the projected range extends to the center in the direction of thickness, or an amorphous layer formed by deposition by the CVD method is crystallized in an hour (i.e., 600° C.). This process was observed with a transmission electron microscope, and it was thereby confirmed that this layer was not crystallized even after 100 hours. That is, it was found that a region in which the material is crystallized and region in which the material is not crystallized can be formed by selecting the ion injection acceleration voltage. FIG. 2 shows the period of time from the start of heat treatment to the start of crystallization (latency time) and the injection depth (projected range). As shown in FIG. 2, if the ion injection depth is larger, the latency time is increased and the material becomes difficult to crystallize. There is a maximum point ($t_{max}$) of the latency time with respect to (projected range)/(film thickness)=1, that is, when the projected range extends to a point in the vicinity of the interface.

From the above-described findings, it is clear that the crystallization temperature and the latency time vary with respect to changes in the injection energy, and it is thought that such variations are due to limitation of non-uniform nucleus formation in the vicinity of the interface.

The thickness of the amorphous semiconductor layer is preferably 50 to 200 nm, more preferably 80 to 150 nm, or most preferably 80 to 120 nm, when the injection depth, the ion injection energy required to attain the injection depth and the capacity of the semiconductor layer are considered.

The nucleus formation position is controlled by utilizing the above-described phenomena, as described below in detail with reference to the drawings.

Figure 3A:
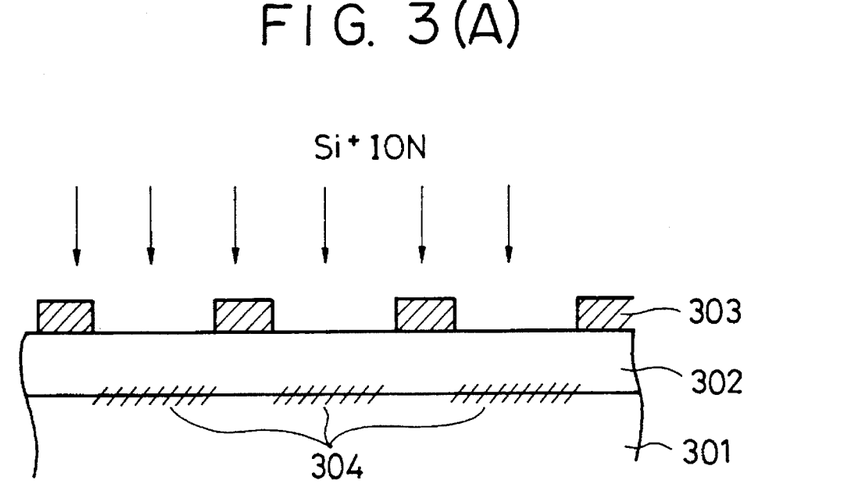
FIG. 3 is a schematic diagram of an example of a process of forming a semiconductor thin film in accordance with the present invention.

As shown in FIG. 3(A), portions of an amorphous Si deposited layer 302 formed on a substrate 301 in correspondence with regions where nuclei are to be generated are covered with a mask such a resist 303. Then, only the regions where no nuclei will be generated are injected with Si ions by selecting the injection energy so that the portions of the amorphous Si layer 302 in the vicinity of the interface between the amorphous Si layer and the substrate 301 are damaged.

Figure 3B:
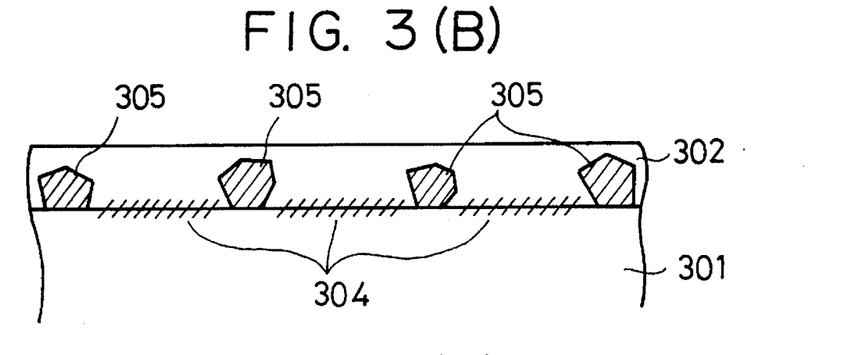

The portion of the amorphous Si layer not masked with the resist 303 is damaged mainly in the vicinity 304 of the interface, so that nucleus regeneration thereafter effected by a heat treatment is limited in this portion. Then, the amorphous Si layer is heat-treated in $N_2$ or $H_2$ at a temperature for a period of time such that the material is not crystallized in the regions where the degree of injection damage is higher (hereinafter referred to as interface-damage regions 304) while the material is crystallized in the regions where the degree of injection damage is lower or zero (hereinafter referred to as non-interface-damage region), which temperature and time are determined from FIGS. 1 and 2. Nuclei are generated at localized positions by this heat treatment. Preferably, the amorphous Si layer is heated at 500° to 700° C. for 10 to 200 hours, more preferably, at 550° to 650° C. for 50 to 100 hours or, most preferably, at 580° to 620° C. for 70 to 100 hours. The area of non-interface-damage region may be made very small [not greater than a 5 μm diameter circle, preferably, not greater than a 2 μm diameter circle or, most preferably, not greater than a 1 μm diameter circle], whereby nuclei are generated at an early stage of the heat treatment and whereby a single crystal 305 grows in each non-interface-damage region (FIG. 3(B)). As the heat treatment proceeds, Si atoms in the amorphous portions are transported into the crystal phase 305 having a single domain. Each crystal thereby continues increasing in size. This phase change from the amorphous phase to the crystalline phase takes place with a lower energy in comparison with nucleus formation under a surface energy deficiency condition. For this reason, before nucleus formation is effected in the interface-damage region, the phase changed portion is taken into the single crystalline phase generated from the non-interface-damage region while the constituent atoms of the interface-damage region are rearranged. Each crystal thereby grows in solid phase. Finally, adjacent crystals collide with each other to form crystal grain boundaries 306 therebetween (FIG. 3(C)).

Figure 3C:
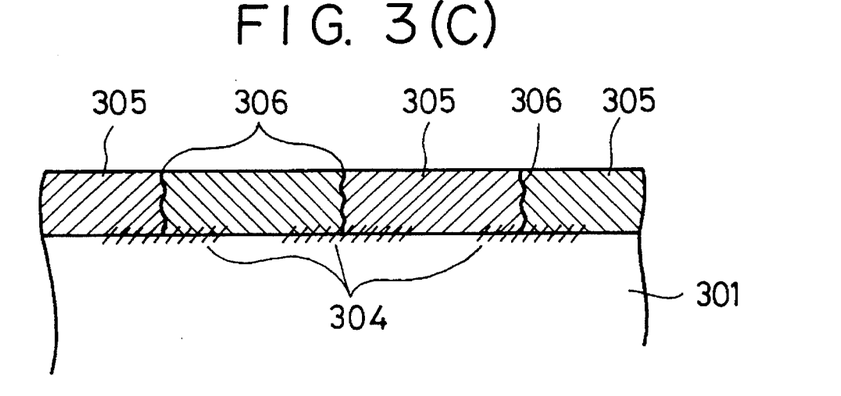

At this time, the crystal grain size is generally equal to the intervals between non-interface-damage regions (nucleus generation regions). Thus, the desired crystal grain size can be determined and the grain boundary positions also can be determined. The interval between the nucleus generation regions is preferably 1 to 10 μm, more preferably 2 to 8 μm, or most preferably 3 to 5 μm. The amorphous thin film in accordance with the present invention is not limited to the one formed from a polycrystalline thin film which is made amorphous by ion injection, and may be formed from a thin film formed into an amorphous structure at the time of deposition.

In a case where the starting material is a polycrystalline thin film, first ion injection for making this film amorphous is effected without any mask so that the projected range extends to a point in the vicinity of the center of the polycrystalline thin film. By this ion injection, the polycrystalline thin film can be made amorphous while avoiding injection damage in the vicinity of the interface between the polycrystalline thin film and the substrate. In a case where a thin film having an amorphous structure is formed at the time of deposition, the step of the first ion injection described above may be deleted. Thereafter, a second ion injection is effected with a mask of a resist or the like provided on the portions corresponding to the small regions so that the projected range extends to a point in the vicinity of the interface between the amorphous thin film and the substrate. By this ion injection, injection damage is caused in the portion other than those covered with the mask in the vicinity of the interface between the amorphous thin film and substrate, thereby enabling prevention of non-uniform nucleus formation in the vicinity of the interface. In the portions on which the mask is provided and which is free from injection damage (non-interface-damage regions), non-uniform nucleus formation can easily be started. Nucleus formation regions are thereby formed in these portions.

In the above-described process, ion injection is effected two times. However, by the selection of the material and the thickness of the mask, the projected range in the film portions corresponding to the small regions can be set to a point in the vicinity of center of the thin film, while the projected range in the other portions can be set to a point in the vicinity of the interface between the amorphous or polycrystalline thin film and the substrate. It is therefore possible to form small regions where the degree of injection damage is low and to make the polycrystalline thin film amorphous simultaneously by one ion injection step.

The mask used in this process is, preferably, a mask formed of a material through which ions to be injected can be transmitted, for example, an inorganic material such as silicon oxide or silicon nitride.

The heat treatment in accordance with the present invention will now be described below.

The inventors of the present invention closely observed the crystalline structure of an amorphous Si layer with a transmission electron microscope before and after irradiating the layer with incoherent light of a lamp, and thereby obtained important findings described below.

1. An amorphous Si layer was directly irradiated with tungsten halogen lamp light (wavelength: 0.5 to 5 μm) and was heated up to a temperature equal to or lower than 1100° C. in a temperature rise time of 10 to 60 seconds and maintained at this temperature for 1 to 3 minutes so that the amorphous Si was crystallized and changed into a polycrystalline thin film having a grain size on the submicron order (<1 μm). It was found that the amount of defects in the crystal grains of the polycrystalline thin film was so small that interference fringes (bend contours) such as those observed only in a case where a thin film having good crystalline properties is deformed were observed.

2. An amorphous Si layer was heat-treated with an electric furnace at 600° C. for 10 to 100 hours to grow in solid phase, so that large-grain-size dendrite crystals having a size on the micron order (>1 μm) were grown. These crystals thereby formed were irradiated with incoherent light of a lamp so as to be heated at a temperature equal to or higher than 1100° C. and lower than the melting point. As a result, it was confirmed that crystalline defects in the grains (stacking faults, micro twins, dislocations) were remarkably reduced as in the case of process 1.

Specifically, in this case, no boundary movement was observed.

With respect to both processes 1. and 2., it was also found that the amount of defects was reduced by increasing the temperature to 1300° C. or 1400° C. (heating time: 3 minutes in each case).

These phenomena can be understood as described below.

With respect to process 1., it may be concluded that the amorphous Si layer was heated up to 1100° C. or higher in about 10 seconds so rapidly that the nucleus forming temperature in the solid phase was higher than that in process 2., that the grain size determined by the grain boundaries formed by collision of the grown grains was very small, i.e., 1 μm, and that movement and extinction of defects were caused by a drive force based on a reduction in the free energy of the defects. At this time, growth of grains was also caused by a drive force based on a reduction in the boundary energy.

In the case of process 2., as described above, the nucleus formation speed in solid phase is reduced by low-temperature annealing so that large-grain-size dendrite polycrystals are grown (to have a grain size of 1 μm or greater by, for example, a heat treatment at 700° C. for 10 hours or longer), and the crystals formed are irradiated with lamp light to be heated at a temperature equal to or higher than 1100° C. and lower than the melting point so that groups of defects are moved and disappear by a drive force based on a reduction in the defect energy.

In this case, however, since the grain size is large, 1 μm or greater, the grain boundary energy is lower than that in the case of process 1., and no grains grow with boundary movement.

The intensity of incoherent light used in accordance with the present invention is set to a level at which temperature of the semiconductor thin film can be increased at a temperature rise rate in the above-mentioned range. Preferably, the intensity of incoherent light is 0.1 W/cm$^2$ or larger.

Figure 4:
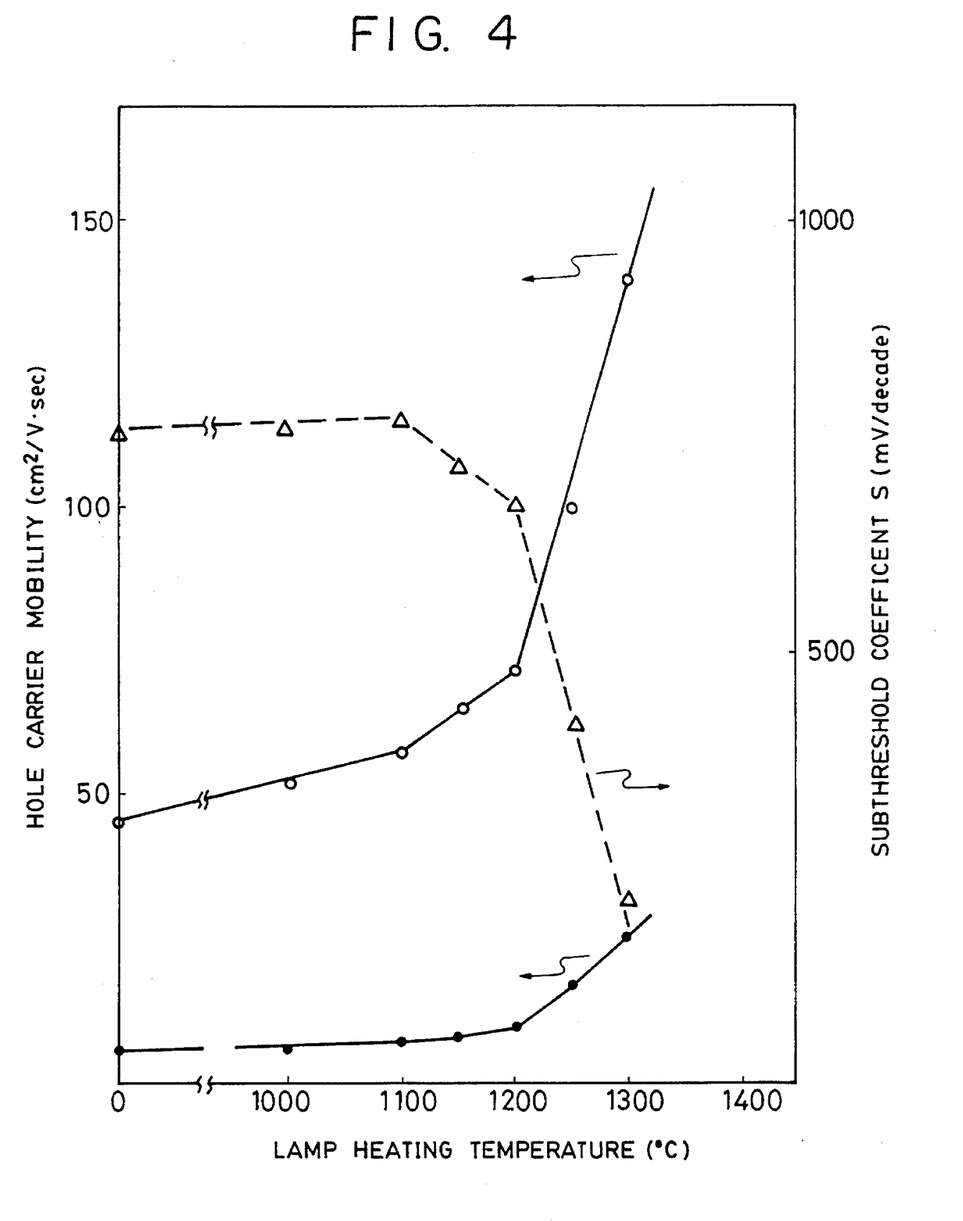
FIG. 4 is a graph of the relationship between heat treatment temperatures and crystalline defects.

Transistors (p-channel field effect transistors) were manufactured on the thus-formed Si thin films each having a crystalline structure uniform over a large area. FIG. 4 shows hole-carrier mobilities and subthreshold characteristics with respect to lamp heating temperatures.

The hole-carrier carrier mobilities of MOS transistors formed on the sample of process 1., i.e., the film formed by directly heating amorphous Si at a high temperature with lamp light are plotted with filled dots (●). The hole-carrier mobilities were generally constant, 10 cm$^2$/V·sec or lower with respect to heat treatments at temperatures not higher than 1100° C. In contrast, the hole-carrier mobilities with respect to heat treatments at temperatures equal to or higher than 1200° C. were remarkably improved, exceeding 10 cm$^2$/V·sec. The subthreshold coefficient characteristics of these transistors were very poor; the subthreshold coefficients were 1000 mV/decade, which cannot be shown in this graph.

The hole-carrier carrier mobilities of field effect transistors (MOS FETs) formed on the sample of process 2., i.e., the film formed by growing crystals in solid phase at a low temperature from amorphous Si until the grain size becomes 1 μm or greater and by irradiating the crystals with lamp light are plotted with filled dots (o). The subthreshold coefficients are plotted with triangles (Δ). Even the carrier mobility of the transistor on the film formed by low-temperature solid phase growth but not irradiated with lamp light exceeded 40 cm$^2$/V·sec. The carrier mobility characteristic was gradually improved with respect to increases in the lamp heating temperatures up to 1100° C. The carrier mobility with respect to lamp heating at 1100° C. was 58 cm$^2$/V·sec. This characteristic was remarkably improved with respect to light irradiation heating at temperatures equal to or higher than 1100°. The carrier mobility with respect to heating at 1300° C. was 140 cm$^2$/V·sec. It was found that the improvement was particularly large with respect to heating temperatures equal to or higher than 1200° C. The subthreshold coefficients were equal to or larger than 700 mV/decade with respect to heating temperatures not higher than 1100° C. The subthreshold coefficients with respect to heat treatment at temperatures higher than 1100° C. were smaller, and remarkable improvements in subthreshold characteristic were observed with respect to temperatures equal to or higher than 1200° C.

These results indicate that a heat treatment process of effecting, before lamp light irradiation, a solid low-temperature heat treatment to increase the grain size, and thereafter effecting a heat treatment with a lamp at a temperature of 1100° C. or higher, or more preferably, 1200° C. or higher, is effective in improving device characteristics.

In the case of lamp heating, the temperature rise rate is high, a temperature of 1100° C. or higher can be reached in a very short time (several seconds), and the temperature can be reduced immediately. Moreover, it is possible to selectively heat up the Si layer alone by selecting the wavelength. As the Si absorption wavelength is changed from 300 nm to 1 μm, the absorption depth changes from 10 nm to 100 μm. To heat up a surface layer alone, a xenon lamp having an emission wavelength spectrum peak between 800 to 900 nm may be used. In these two respects, lamp heating is more advantageous than heating using an electric furnace ordinarily used. In particular, it is difficult to increase the temperature at a rate of 1100° C. in several seconds in the case of heating with the ordinary electric furnace. According to the present invention, it is also possible to generate nuclei at desired positions and, hence, to form a semiconductor thin film while controlling the grain size and the positions of grain boundaries so that the active region of a device can be formed by avoiding grain boundaries which cause a deterioration in device characteristics. It is therefore possible to obtain a device equivalent in characteristics to a device formed on a monocrystalline semiconductor substrate.

Table 1 shows a dispersion of the threshold value ($V_{Th}$) of fifty p-channel field effect transistors (samples A) manufactured on a 4-inch wafer formed by effecting solid phase growth to a size on the μm order and heating at 1350° C. with a halogen lamp. Carrier mobilities (μ), which are indices of the operating performance of the transistors, are shown in the lower section of Table 1.

TABLE 1

| Samples | A | B | C |
| --- | --- | --- | --- |
| σ($V_{th}$) mV | | | |
| L = 10 μm | 96.2 | 45.1 | 10.9 |
| L = 3 μm | 235.2 | 40.3 | 10.1 |
| μ(cm$^2$/V sec) | | | |
| L = 10 μm | 150.3 | 150.9 | 220.8 |
| L = 3 μm | 148.2 | 180.3 | 220.2 |

Samples B are transistors formed by effecting lamp heating at 1350° C. after grain boundary position control, and samples C are transistors formed on a bulk Si wafer. There are two channel lengths (L) of 10 μm and 3 μm. The design distance between grain boundaries is set to 5 μm (Samples B).

In the case of samples B having grain boundary positions uncontrolled, the dispersion σ with respect to the short channel is greater. In the case of samples C having grain boundary positions controlled, the dispersion σ with respect to the short channel is smaller, and the carrier mobility is increased.

Thus, the thin film can be improved in uniformity so that the performance of a device formed thereon is high, if the thin film is formed by heating at a high temperature a large-grain-size dendrite polycrystal having position-controlled grain boundaries so as to reduce defects. This effect is very important to manufacture of integrated circuits.

The present invention has been achieved based on the understanding of the essential importance of arranging the crystal regions by precisely controlling the position, shape and area thereof. That is, the present invention is based on the idea of forming crystals having an improved crystalline structure such that no grain boundary acting as a main cause of a device characteristic distribution is formed in a particular thin film region previously designed.

Figure 5A:
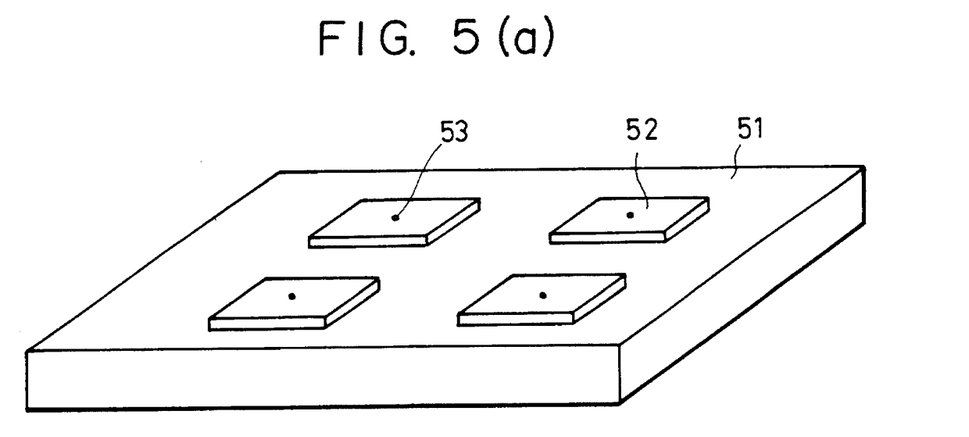
FIG. 5 is a schematic diagram of another example of the semiconductor film formation process in accordance with the present invention.

Another process of the present invention will be described below with reference to FIG. 5.

Figure 5B:
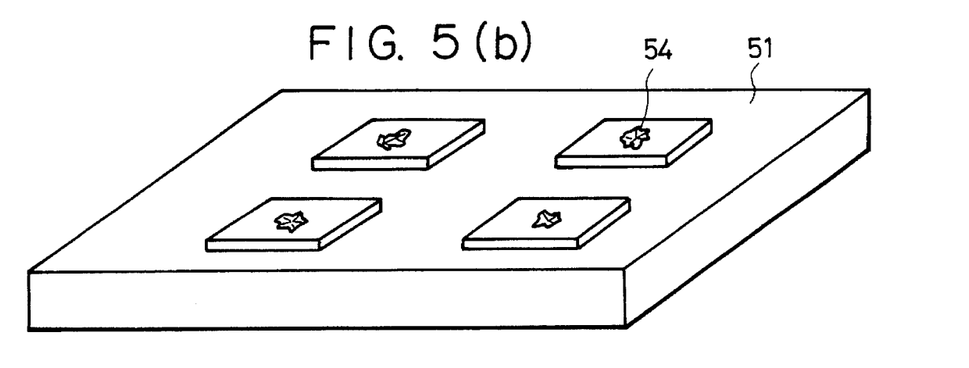

Amorphous semiconductor layers 52 separated from each other and each having a size most suitable for forming a device are formed on a substrate 51. The semiconductor layers 52 are formed by using the CVD method, photolithography used for the ordinary IC process, and reactive ion etching. According to the present invention, it is preferable to form each separate amorphous thin film into, for example, the shape of a 5 to 10 µm square or the shape of a circle having a diameter of about 5 to 10 µm. Next, a nucleus formation site is defined on each separate amorphous semiconductor land at the center thereof by the same ion injection as that described above. Thereafter, by a heat treatment, a single nucleus 54 of a dendrite crystal is thereby grown in solid phase in each site (FIG. 5 (b)).

That is, ions of the constituent material of the amorphous thin film are injected into the amorphous thin film so that a small region where the degree of damage caused by ion injection is low in comparison with the other region is formed in the amorphous thin film in the vicinity of the interface between the amorphous thin film and the substrate, and a heat treatment at a temperature lower than the melting point is thereafter effected.

Figure 5C:
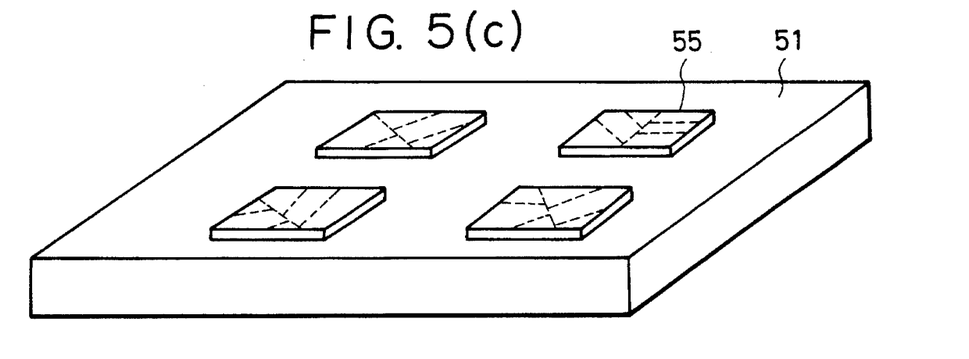

As the crystal growth is continued, the crystal 54 grown from the single nucleus in each site continues growing until the whole land is changed into the crystalline phase having a single domain so that no grain boundary is formed in the land (FIG. 5(c)). In this case, it is necessary to effect ion injection so that a single nucleus grows in the land of each of the amorphous thin films arranged separately from each other.

Although no grain boundary exists in each land, twin planes remain as shown in FIG. 5(c) and a multiplicity of crystalline defects also exist. The influence of crystal defects including twins, dislocations and the like is not considerable if this crystal is used for low-performance device such as a thin-film transistor. That is, the twin planes and internal defects do not influence device characteristics as badly as grain boundaries. However, if this crystal is used to manufacture a high-performance device as that found on a bulk, the influence is serious and the defects must be removed.

A heat treatment using incoherent light, which enables only the thin film to be heated at a high temperature over a large area, is most suitable for removing these kinds of defects, as described above.

Examples of the present invention will be described below.

EXAMPLE 1

A heat-oxidized $SiO_2$ film having a thickness of 0.1 µm was formed on a 4-inch Si wafer, and an amorphous Si film was deposited thereon to a thickness of 100 nm by the ordinary CVD method.

At this time, $SiH_4$ gas was used as source gas, the temperature was 550° C., and the pressure was 0.3 Torr.

Thereafter a resist was applied and circular resist patterns having a diameter of 1 µm arranged at 5 µm intervals like lattice points were left by ordinary photolithography.

$Si^+$ ions were injected at an energy of 70 keV through the whole surface while using these resist patterns as a mask. The amount of injected ions was set to $3 \times 10^{15}$ $cm^{-2}$. At 70 keV injection energy, the projected range extends to a position in the vicinity of the interface between the Si film having a thickness of 100 nm and the $SiO_2$ glass. In all the regions other than those located below the 1 µm resist patterns, damage was caused at the interface ($Si/SiO_2$). After removing the resist, a heat treatment in $N_2$ atmosphere at 630° C. for 80 hours was effected by using an electric furnace to grow crystals in solid phase. The obtained crystalline thin film was observed with a transmission electron microscope and it was thereby found that the crystal grain boundaries were arranged at intervals of about 5 µm generally corresponding to the pattern intervals, and that the grain size distribution is within the range of ±1 µm about the average size of 5 µm.

Next, an $SiO_2$ layer having a thickness of 50 nm was formed as a cap layer on the surface of the Si thin film by sputtering in order to prevent the surface from being roughened during irradiation with light.

From the thin film member thus formed, six samples were formed by irradiating the two surfaces with a tungsten halogen lamp for heating at 1100° C., 1350° C. and 1400° C. for 3 minutes. The atmosphere was $N_2$ gas, and the temperature rise rate was set to 200° C./sec. Thereafter p-channel field effect transistors having polysilicon gates were formed on 4-inch wafers by an IC process. The channel lengths were 10 µm and 3 µm.

Improved transistors having a large carrier mobility and a restricted threshold value distribution were thereby obtained.

Also, the same effects were obtained when a heat treatment in $H_2$ atmosphere was effected instead of the heat treatment in $N_2$ atmosphere.

EXAMPLE 2

$SiH_4$ was heat-decomposed on a substrate member formed of a glass plate by a low pressure CVD method to deposit a polycrystalline Si thin film having a thickness of 100 nm. The forming temperature was 620° C., the pressure was 0.3 Torr, and the grain size was very small, about 50 nm. $Si^+$ ion injection was effected two times. First, $Si^+$ ions were injected through the whole surface of the polycrystalline Si thin film at an injection energy of 40 keV without any resist mask. The amount of injected ions was $3 \times 10^{15}$ $cm^{-2}$. The vacancy due to knocked-out silicon atoms was thereby made continuous, and the polycrystalline Si thin film was made amorphous. The projected range at 40 keV was approximated to half the thickness of 100 nm of the film, so that substantially no damage was caused in the vicinity of the interface on the $Si/SiO_2$ substrate.

Thereafter, resist mask patterns having a diameter of 1 µm were arranged at 5 µm intervals like lattice points, as in the case of Example 1, and second $Si^+$ ion injection was effected at an injection energy of 70 keV to cause damage in the vicinity of the interface. The amount of injected ions was the same as the first injection. After the separation of the resist, a heat treatment in $N_2$ at 620° C. for 100 hours was effected. In the structure thereby formed, the grain size was 5±1 µm as in the case of Example 1, and the grain boundaries were arranged like a lattice.

Further, an $SiO_2$ film having a thickness of 50 nm was formed on the Si thin film having position-controlled grain boundaries, and five samples were formed from the thus-formed film member by being irradiated with tungsten halogen lamp light for heating at 1100° C., 1200° C., 1300° C., 1350° C., and 1400° C. for 3 minutes, with an Si wafer placed as a light-absorbing member in contact with the upper surface thereof. The temperature rise rate was set to 200° C./sec, and the atmosphere was $N_2$.

After removing the cap SiO$_2$ film, field effect transistors were manufactured in the same manner as Example 1. The characteristics of the transistors thereby obtained were good.

EXAMPLE 3

An amorphous Si thin film was deposited on a quartz base provided as a substrate member to have a thickness of 100 nm by electron beam deposition in high vacuum under the following conditions:

ultimate vacuum: $1\times10^{-10}$ Torr vacuum during deposition: $5\times10^{-10}$ Torr base temperature: 150° C.

deposition speed: 100 nm/hr at the maximum.

Resist patterns were formed on this amorphous Si thin film by ordinary photolithography to cover 1 μm square regions thereof arranged at 5 μm intervals like lattice points.

Then, Si ions accelerated at an energy of 70 keV were injected over the whole substrate so that the amount of injected ions was $1\times10^{15}$ cm$^{-2}$. In this case, the Si ion projected range in Si was 99.7 nm, and Si ions were therefore distributed mostly in the vicinity of the interface between the portion of the amorphous Si thin film not covered with the resist and the quartz base, so that an amount of damage was caused at the interface.

After the removal of the resist, a heat treatment was effected in N$_2$ atmosphere by maintaining the base temperature at 590° C. About 15 hours after the start of the heat treatment, crystal nuclei started growing in the 1 μm square regions not injected with Si ions during the second injection. At this time, no nuclei were formed in the region which was not covered with the resist and into which Si ions were injected. As annealing was further continued, the crystal nuclei already formed in the 1 μm square regions grew laterally exceeding the limits of the regions, and became large-grain-size dendrite thin film crystals. After further annealing for about 120 hours, the growing end face of each crystal grain was in contact with those of other crystal grains growing from adjacent regions at a distance of about 5 μm, thereby defining grain boundaries, and the amorphous Si thin film was crystallized over the whole area. As a result, groups of thin film crystals having an average grain size of 5 μm were obtained in which the grain boundaries were arranged generally at 5 μm intervals like a lattice.

As in Example 1 or 2, the crystals obtained were heated with halogen lamp light, and field effect transistors were manufactured.

Si thin films solid-phase grown and having position-controlled grain boundaries in accordance with Examples 1, 2 and 3 were heat-treated at a high temperature with lamp light, and the positions of the grain boundaries were thereafter observed with a transmission electron microscope. No boundary movement was thereby observed.

EXAMPLE 4

An amorphous Si layer was deposited on a glass base having SiO$_2$ as a main constituent to have a thickness of 100 nm by the low pressure CVD method.

SiH$_4$ gas was used as source gas, the temperature was 550° C., and the pressure was 0.3 Torr. $1\times10^{15}$ ions/cm$^2$ Si$^+$ ions were injected at 40 keV through the whole surface of this amorphous Si layer. Thereafter a resist was applied and circular resist patterns having a diameter of 1 μm arranged at 15 μm intervals like lattice points were left by ordinary photolithography.

Si$^+$ ions were injected at 70 keV through the whole surface while using these resist patterns as a mask. The amount of injected ions was set to $3\times10^{15}$ cm$^{-2}$. At 70 keV injection energy, the projected range extends to a position in the vicinity of the interface between the 100 nm Si layer and the SiO$_2$ glass. In all the regions other than those located below the 1 μm resist patterns, damage was caused at the interface (Si/SiO$_2$). After the removal of the above resist patterns, the resist was thereafter applied again and grooves defining a lattice shape and having a width of 3 μm were formed between the above lattice points by effecting reactive ion etching on the amorphous Si layer. That is, a plurality of 12×12 μm amorphous Si lands were formed whose centers were located at nucleus formation sites arranged in correspondence with lattice points mentioned above. A heat treatment in N$_2$ atmosphere at 630° C. for 80 hours was thereafter effected. The Si lands heat-treated were observed with a transmission electron microscope, and it was thereby found that the whole material in the 12×12 μm regions was changed into crystals each having a single domain and containing twin planes, and that there were no internal grain boundaries.

The crystalline lands were further heat-treated at 1300° C. for 3 minutes with a tungsten halogen lamp, so that residual defects in the lands were remarkably reduced. Good crystalline properties were confirmed by observation with the transmission electron microscope; bend-extion contours were observed over a large area.

Field effect transistors (MOSFETs) were manufactured on these crystalline lands. It was confirmed that the MOSFETs obtained had carrier mobilities substantially equal to 90% of that of a device manufactured on bulk Si and also stand comparison with the bulk device with respect to the threshold value dispersion.

EXAMPLE 5

SiH$_4$ was heat-decomposed on a substrate member formed of a glass plate by a low pressure CVD method to deposit a polycrystalline Si thin film having a thickness of 100 nm. The forming temperature was 620° C., the pressure was 0.3 Torr, and the grain size was very small, about 50 nm. Si$^+$ ion injection was effected two times. First, Si$^+$ ions were injected through the whole surface of the polycrystalline Si thin film at an injection energy of 40 keV without any resist mask. The amount of injected ions was $3\times10^{15}$ cm$^{-2}$. Damages in the polycrystalline Si thin film thereby became continuous, and the polycrystalline Si thin film was made amorphous. The projected range at 40 keV was approximated to half the thickness of 100 nm of the film, so that substantially no damage was caused in the vicinity of the interface on the Si/SiO$_2$ substrate.

Thereafter, resist mask patterns having a diameter of 1 μm were arranged at 15 μm intervals like lattice points, as in the case of Example 4, and second Si$^+$ ion injection was effected at an injection energy of 70 keV to cause damage in the vicinity of the interface. The amount of injected ions was the same as the first injection. After the separation of the resist, the resist was applied again and grooves defining a lattice shape and having a width of 3 μm were formed between the above lattice points by effecting reactive ion etching on the amorphous Si layer. That is, a plurality of 12×12 μm amorphous Si lands were formed whose centers were located at nucleus formation sites arranged in correspondence with lattice points mentioned above. A heat treatment in N$_2$ at 620° C. for 100 hours was thereafter effected. As a result, single domain crystals having no grain boundaries were formed in the 12×12 μm Si lands, as in the case of Example 4.

EXAMPLE 6

An amorphous Ge thin film having a thickness of 50 nm was formed on a substrate formed of $SiO_2$ by vacuum deposition using an electron beam. The degree of vacuum was $1\times10^{-6}$ Torr, and the substrate temperature was set to room temperature. Regions having a diameter of 1.5 μm and arranged at intervals of 15 μm were masked with a resist, and $Ge^+$ ion injection at 130 keV was effected over the whole area. The amount of injection was $2\times10^{15}$ $cm^{-2}$. The Ge ion injection depth was about 50 nm from the surface and the ions were mainly injected in a region in the vicinity of the interface on the substrate, thereby damaging the corresponding interface portion. After the removal of the resist patterns, the resist was applied again and grooves defining a lattice shape and having a width of 3 μm were formed between the above lattice points by effecting reactive ion etching on the amorphous Ge layer. That is, a plurality of 12×12 μm amorphous Ge lands were formed whose centers were located at the nucleus formation sites arranged in correspondence with lattice points mentioned above. A heat treatment in $N_2$ or $H_2$ atmosphere at 380° C. for 50 hours was thereafter effected. Single crystals thereby grew from only the small regions which were covered with the mask to inhibit $Ge^+$ ion injection and which were free from damage at the interface. Crystals also grew in the amorphous Ge region where damage was caused at the interface by $Ge^+$ ions. As a result of examination of the crystalline structure with a transmission electron microscope, a single-domain crystal grew in each 12×12 μm land and there was no grain boundary in the land.

What is claimed is:

1. A method of forming a semiconductor thin film comprising the steps of:
   (a) forming an amorphous thin film on a substrate;
   (b) selectively injecting ions into said amorphous thin film with an injection energy satisfying the following relation: injection depth of ions into amorphous thin film/ amorphous thin film thickness=1; and
   (c) crystallizing said amorphous thin film by conducting a heat treatment.

2. The method according to claim 1, including forming the amorphous thin film by deposition.

3. The method according to claim 1, including forming said amorphous thin film in step (a) by injecting ions into a polycrystalline film deposited on said substrate.

4. The method according to claim 1, wherein said substrate is $SiO_2$.

5. The method according to claim 1, including forming said amorphous thin film in step (a) with grooves defining a lattice shape.

6. The method according to claim 1, including employing said ions of the same material as said amorphous thin film.

7. The method according to claim 1, including forming the amorphous thin film in step (a) of silicon.

8. The method according to claim 7, including employing said ion injection energy from 40 to 80 keV.

9. The method according to claim 7, including employing said ion injection energy at 70 keV.

10. The method according to claim 1, including in step (c) conducting said heat treatment at a temperature from 500° C. to 700° C.

11. The method according to claim 10, including conducting a second heat treatment at a temperature of 1100° C. or higher after said heat treatment.

12. The method according to claim 11, including conducting said second heat treatment by irradiating with incoherent light.

13. The method according to claim 1, wherein said selective injecting of ions is performed employing masks patterned on said amorphous thin film by lithography.

14. The method according to claim 1, including forming said amorphous thin film in step (a) at a thickness from 50 to 200 nm.

15. The method according to claim 1, including forming said amorphous thin film in step (a) at a thickness of 100 nm.

16. The method according to claim 13, including arranging said masks as lattice points.

17. The method according to claim 13, including employing said masks having a diameter of 1.0 to 1.5 μm.

18. The method according to claim 13, including arranging said masks at intervals of 5 to 15 μm.

* * * * *

UNITED STATES PATENT AND TRADEMARK OFFICE
CERTIFICATE OF CORRECTION

PATENT NO. : 5,495,824
DATED : March 5, 1996
INVENTOR(S) : TAKAO YONEHARA ET AL.      Page 1 of 2

It is certified that error appears in the above-identified patent and that said Letters Patent is hereby corrected as shown below:

On the title page:

AT [56] REFERENCES CITED

U.S. Patent Documents, insert
--4,331,485  5/1982  Gat  148/1.5--.

Foreign Patent Documents, insert
--289114  11/1988  Eur. Pat. Off.--.

Other Publications, insert
--Patent Abstracts of Japan, Vol. 8, No. 4 (E-220)[1441], Jan. 10, 1984. Applied Physics Letters, Vol. 53, No. 26, Dec. 26, 1988, pp. 2611-2613--.
Under E. Murakami et al., "Materials" should read --Materials",--.

AT [75] INVENTORS

"Kanagawa" should read --Atsugi--.

COLUMN 2

Line 45, "convention" should read --conventional--.

COLUMN 4

Line 44, "addition" should read --addition,--.

COLUMN 5

Line 33, "is" (second occurrence) should be deleted.

UNITED STATES PATENT AND TRADEMARK OFFICE
CERTIFICATE OF CORRECTION

PATENT NO. : 5,495,824
DATED : March 5, 1996
INVENTOR(S) : TAKAO YONEHARA ET AL.

It is certified that error appears in the above-identified patent and that said Letters Patent is hereby corrected as shown below:

<u>COLUMN 9</u>

Line 38, "filled" should read --unfilled--.

<u>COLUMN 14</u>

Line 27, "bend-extion" should read --bend-extension--.

Signed and Sealed this

Twentieth Day of August, 1996

Attest:

BRUCE LEHMAN

*Attesting Officer*  *Commissioner of Patents and Trademarks*